United States Patent [19]

Sanwo et al.

[11] Patent Number: 4,749,887
[45] Date of Patent: Jun. 7, 1988

[54] 3-INPUT EXCLUSIVE-OR GATE CIRCUIT

[75] Inventors: Ikuo J. Sanwo, San Marcos; Mukesh B. Suthar, Sunnyvale, both of Calif.

[73] Assignee: NCR Corporation, Dayton, Ohio

[21] Appl. No.: 64,625

[22] Filed: Jun. 22, 1987

[51] Int. Cl.[4] .......................................... H03K 19/21
[52] U.S. Cl. .................................. 307/471; 307/451; 307/585; 371/49
[58] Field of Search ............... 307/443, 448, 451, 471, 307/472, 584, 585; 371/25, 49; 364/738, 784

[56] References Cited

U.S. PATENT DOCUMENTS

| | | | |
|---|---|---|---|
| 4,049,974 | 9/1977 | Boone et al. | 371/49 X |
| 4,367,420 | 1/1983 | Foss et al. | 307/471 X |
| 4,430,737 | 2/1984 | Beranger et al. | 371/49 |
| 4,451,922 | 5/1984 | Dearden et al. | 371/49 |
| 4,453,096 | 6/1984 | Le Can et al. | 307/451 X |
| 4,541,067 | 9/1985 | Whitaker | 307/471 X |
| 4,558,236 | 12/1985 | Burrows | 307/471 X |
| 4,575,648 | 3/1986 | Lee | 307/451 X |
| 4,617,477 | 10/1986 | DePaolis, Jr. | 307/451 X |
| 4,646,306 | 2/1987 | Davis et al. | 371/49 |
| 4,710,649 | 12/1987 | Lewis | 307/451 |

FOREIGN PATENT DOCUMENTS

| | | | |
|---|---|---|---|
| 2165162 | 2/1981 | Fed. Rep. of Germany | 307/471 |
| 0019058 | 2/1977 | Japan | 307/471 |

OTHER PUBLICATIONS

Puri et al, "Three-Input Exclusive OR", IBM T.D.B., vol. 24, No. 7A, Dec. 1981, p. 3114.
"CMOS Transfer Gate Exclusive OR Circuit", IBM T.D.B., vol. 28, No. 10, Mar. 1986, pp. 4303-4304.
Griffin et al, "Three-Way Exclusive-OR Circuit", IBM T.D.B., vol. 25, No. 11B, Apr. 1983, pp. 6062-6063.

Primary Examiner—Stanley D. Miller
Assistant Examiner—D. R. Hudspeth
Attorney, Agent, or Firm—Wilbert Hawk, Jr.; Edward Dugas

[57] ABSTRACT

The present invention is an Exclusive-OR circuit which uses a minimum number of components and which is particularly adapted for use as a building block for a parity checking circuit. The circuit only uses CMOS gates to reduce the number of included transistors.

7 Claims, 1 Drawing Sheet

3-INPUT EXCLUSIVE-OR GATE CIRCUIT

BACKGROUND OF THE INVENTION

The present invention relates to an Exclusive-OR gate circuit and more particularly to a 3-input CMOS type Exclusive-OR gate circuit which is particularly adapted for combining with other like circuits in a parity checking circuit configuration.

Parity checking circuits verify the correct operation of a data processing system by completing the count for a group of bits such that a correct group of bits and the parity bit will always be, for example, an even count. A single bit error will make the count odd, thereby indicating the existence of the error. Generally speaking, a data processing system is designed to operate on groups of 8 bits, each commonly called a byte. Each group of 8 bits has 1 parity bit appended to it, such that each group of 9 error free bits always includes an even or an odd number of 1's depending on the type of parity convention designed into the processor.

Traditional implementations of parity circuits use 8, 2-input Exclusive-OR gates for processing a byte (8 bits) and an associated parity bit (1 bit). The present inventive circuit is configured to receive three input signals. The traditional implementations experience a significant delay in signal processing because of the large number of gates used. It is therefore, highly desirable to use the least number of gates to accomplish the desired Exclusive-OR function with the least amount of signal delay.

A patent of particular interest for its teaching of an Exclusive-OR circuit that may be used in a parity checking circuit and for an extensive listing of prior art publications is U.S. Pat. No. 4,430,737 entitled, "Exclusive-OR Circuit and Parity Checking Circuit Incorporating the Same" by H. Beranger et al.

Another patent of interest is U.S. Pat. No. 4,319,148, entitled, "High Speed 3-Way Exclusive-OR Logic Circuit" by S. D. Malaviya wherein is disclosed a circuit which performs an OR function with a delay essentially equal to that experienced in a single logic stage.

Another patent of interest is U.S. Pat. No. 4,417,161 entitled, "Complemetary Channel Type MOS Transistor Exclusive-OR/NOR Logic Gate Circuit" by M. U. Kadoma wherein is disclosed a two input Exclusive-OR gate which is implemented in CMOS with a reduced number of transistors from that of conventional circuits.

Other patents of interest are U.S. Pat. Nos. 4,651,296 entitled, "High Speed CMOS FET Full-Adder Circuit" by H. Koike which is implemented in CMOS logic and 4,626,711, entitled, "Exclusive-OR Gate Circuit", by G. M. Li which discloses an Exclusive-OR gate that is suitable for use as a parity bit generator.

SUMMARY OF THE INVENTION

In the preferred circuit embodiment of the present invention, there is provided a first inverting means for receiving three input signals and for providing three inverted input signals; a pair of current switches serially connected together at a juncture defining a first node; a means for receiving a first of the provided three inverted input signals and for outputting signals to the pair of current switches corresponding to the inverted input signal; and the complement of the inverted input signal, such that only one of the pair of current switches is turned on at any time. Additionally, there is provided a second inverting means for receiving the signal at the first node and for having an output providing the circuit's output signal; a means of a first type responsive to the second and the third of the provided three inverted input signals for gating the signals to one current switch of the pair of current switches; and means of a second type, complementary to the first type, responsive to the second and the third of the provided three inverted input signals for gating the signals to the other current switch of the pair of current switches.

From the foregoing it can be seen that it is a primary object of the present invention to provide a 3-input Exclusive-OR gate circuit which utilizes a minimum number of transistor gates.

It is another object of the present invention to provide an Exclusive-OR circuit which may be combined with other like circuits to form a parity generator.

These and other objects of the present invention will become more apparent when taken in conjunction with the following description and drawings wherein like characters indicate like parts, and which drawings form a part of this disclosure.

DESCRIPTION OF THE PREFERRED EMBODIMENT

Figure 1:
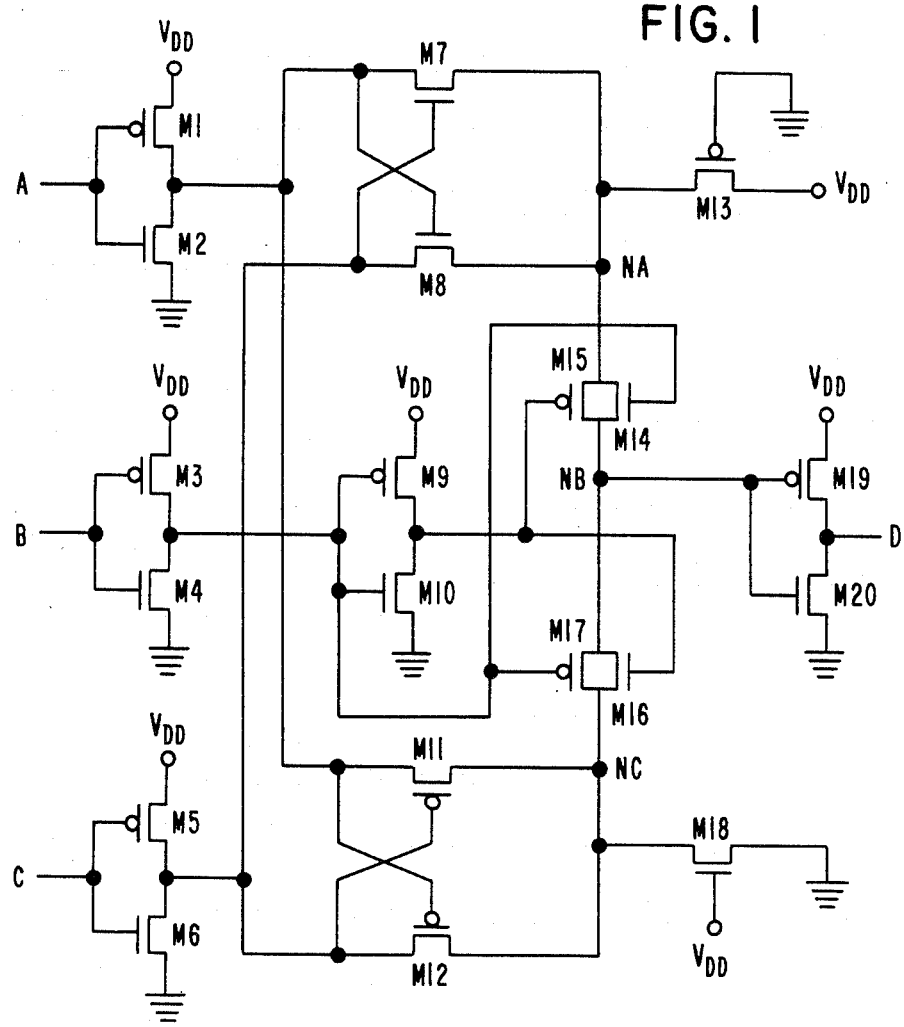
FIG. 1 is a schematic diagram of the preferred embodiment of the present invention.

Referring to FIG. 1, the Exclusive-OR gate circuit embodiment of the present invention is shown having three inputs labeled A, B and C, and one output labeled D. Three pairs of CMOS transistors, M1–M2, M3–M4 and M5–M6, form first, second and third inverters, respectively. Each of the inverters is connected to one of the labeled inputs. The inverters function to invert the logic level of the signals on their inputs. The inverted signals are taken from the juncture of the respective pairs of CMOS transistors. Each of the inverters is connected between a power potential terminal labeled VDD and a reference potential terminal which in the preferred embodiment is ground. The output from the first inverter is connected to a first pair of MOS gates of first channel type, M11–M12, and to a second pair of MOS gates, M7–M8, of second channel type. In a like manner, the output signal from the third inverter is connected to the first pair and the second pair of MOS gates, M11–M12 and M7–M8, respectively. The gates are formed of MOS transistors each having a source, drain and gate electrode. The source and drain electrodes constitute a current path which path is controlled by the potential on the gate electrode. A circle on the gate electrode of the MOS devices, shown in the drawings, indicates a P-channel device and the absence of a circle indicates an N-channel device. The first pair of MOS gates, being of the P-channel type, and the second pair of MOS gates, being of the N-channel type, makes the first pair of MOS gates responsive to signals which are complementary to those to which the second pair of MOS gates would be responsive.

In the preferred embodiment, there is a cross coupling such that the gate electrode of M7 is connected to the output of the third inverter while the gate electrode of M8 is connected to the output of the first inverter. In a like manner, the gate electrode of M11 is connected to the output of the third inverter and the gate electrode of M12 is connected to the output of the first inverter. The first and second pair of MOS gates connect to the remainder of the circuit via their current paths at nodal points NA and NC, respectively. A first P-channel, MOS gate M13, connects the nodal point NA to a power potential terminal denoted VDD. The gate electrode of MOS device M13 is connected to the reference potential. A second N-channel, MOS gate M18, connects the nodal point NC to the reference potential and has its gate electrode connected to the power potential terminal VDD. A first pair of parallel connected complementary MOS gates, M14 and M15 (commonly called a transmission gate), is connected between the nodal point NA and a nodal point NB. In a like manner, a second pair of parallel connected complementary MOS gates, M16 and M17, are connected between the nodal point NB and NC. These transmission gates operate as current switches in response to the signals appearing on their gate electrodes. These signals are generated by a modified inverter circuit comprises of complementary MOS transistors M9 and M10. The gate electrodes of devices M9 and M10 are coupled to the output of the second inverter circuit formed from devices M3 and M4. The first output is taken from the junction point of devices M3 and M4 and is directed to the gate electrode of device M9 and to the gate electrode of device M10 and to the gate electrode of device M17 and to the gate electrode of device M14. The second output, which is complementary to the first output, is taken from the junction point of devices M9 and M10 and is directed to the gate electrode of device M15 and to the gate electrode of device M16. The signal resulting at the node NB is directed to a fourth inverter circuit formed from the MOS devices M19 and M20. The circuit output is taken from the juncture of the device M19 and M20.

In the following truth table, labeled TABLE 1, there is disclosed the relationship between the logic level of the signals on the inputs labeled A, B and C and the logic level of the signals on the internal nodes NA, NB and NC, and finally their relationship to the logic level of the signal on the output labeled D. In the nomenclature used in Table 1, L stands for a low level signal and H stands for a high level signal. For those knowledgeable in this art, it can be quickly deduced that the logic level of the signal on the output D is an Exclusive-OR function of the logic level of the signals on the inputs A, B and C.

TABLE 1

| Truth Table for 3-Input Exclusive OR | | | | | | |
|---|---|---|---|---|---|---|
| Input | | | Internal Nodes | | | Output |
| A | B | C | NA | NB | NC | D |
| L | L | L | H | H | L | L |
| L | L | H | L | L | H | H |
| L | H | L | H | L | L | H |
| L | H | H | L | H | H | L |
| H | L | L | L | L | H | H |

TABLE 1-continued

| Truth Table for 3-Input Exclusive OR | | | | | | |
|---|---|---|---|---|---|---|
| Input | | | Internal Nodes | | | Output |
| A | B | C | NA | NB | NC | D |
| H | L | H | H | H | L | L |
| H | H | L | L | H | H | L |
| H | H | H | H | L | L | H |

In the following state table, labeled TABLE 2, there is disclosed the "ON" and "OFF" states for each of the MOS gates labeled M1-20 for the full range of logic possibilities for the signals applied to the inputs A, B and C.

TABLE 2

| A B C | M1 | M2 | M3 | M4 | M5 | M6 | M7 | M8 | M9 | M10 | M11 | M12 | M13 | M14 | M15 | M16 | M17 | M18 | M19 | M20 |
|---|---|---|---|---|---|---|---|---|---|---|---|---|---|---|---|---|---|---|---|---|
| L L L | ON | OFF | ON | OFF | ON | OFF | ON | ON | OFF | ON | OFF | OFF | ON | ON | ON | OFF | OFF | ON | OFF | ON |
| L L H | ON | OFF | ON | OFF | OFF | ON | OFF | ON | OFF | ON | ON | OFF | ON | ON | ON | OFF | OFF | ON | ON | OFF |
| L H L | ON | OFF | OFF | ON | ON | OFF | ON | ON | ON | OFF | OFF | OFF | ON | OFF | OFF | ON | ON | ON | ON | OFF |
| L H H | ON | OFF | OFF | ON | OFF | ON | OFF | ON | OFF | ON | OFF | ON | ON | OFF | OFF | ON | ON | ON | OFF | ON |
| H L L | OFF | ON | ON | OFF | ON | OFF | ON | OFF | OFF | ON | OFF | ON | ON | ON | ON | OFF | OFF | ON | ON | OFF |
| H L H | OFF | ON | ON | OFF | OFF | ON | OFF | OFF | OFF | ON | ON | ON | ON | ON | ON | OFF | OFF | ON | OFF | ON |
| H H L | OFF | ON | OFF | ON | ON | OFF | ON | OFF | ON | OFF | OFF | ON | ON | OFF | OFF | ON | ON | ON | OFF | ON |
| H H H | OFF | ON | OFF | ON | OFF | ON | OFF | OFF | ON | OFF | ON | ON | ON | OFF | OFF | ON | ON | ON | ON | OFF |

The circuit of FIG. 1, thus far described, finds particular utility as a building block for a parity circuit.

Figure 2:
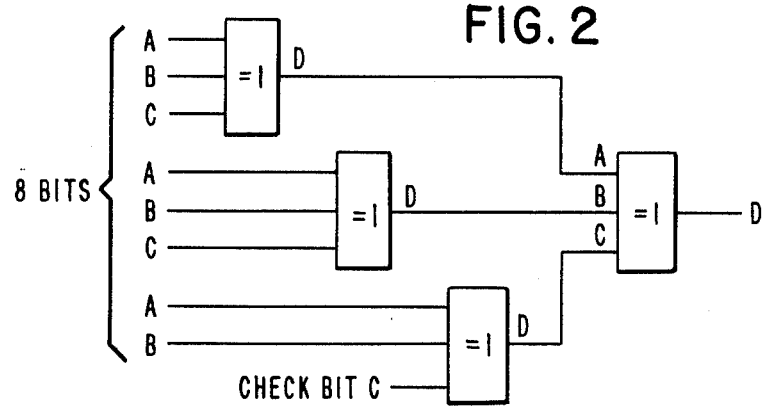
FIG. 2 is a block logic diagram illustrating the configuration of a parity checking circuit incorporating four of the circuits shown in FIG. 1.

Referring to FIG. 2, four of the Exclusive-OR gates of FIG. 1 are shown interconnected so as to form a parity checking circuit which circuit receives as inputs 8-bits (byte) of data with the ninth input being the parity check bit. The output of the parity checking circuit will be of a first logic level when the 8 bits and the check bit are in a correct relationship and will be of a second logic level when any of the 8 bits are in error.

Although the invention has been described and illustrated in detail, it is to be understood that the same is by way of illustration and example only and is not to be taken by way of limitation, the spirit and scope of this invention being limited only by the terms of the appended claims.

We claim:

1. A 3-input Exclusive-OR gate circuit comprising:
   first, second and third inverters each having an input for receiving one of three logical input signals and an output for providing a signal which is an inverted input signal;
   a first and second pair of parallel connected CMOS gates serially connected at a junction defining a first node, each CMOS gate having a gate electrode and a current path;
   a power potential terminal;
   a reference potential terminal;
   a first MOS gate, of first channel type, connecting said first pair of parallel connected CMOS gates to said power potential terminal at a junction defining a second node;
   a second MOS gate, of second channel type, connecting said second pair of parallel connected CMOS gates to said reference potential at a junction defining a third node;
   a fourth inverter having an input and an output, said input connected to the first node and said output being the circuit's output;
   first means connected between the output of said third inverter and said first and second pair of parallel connected CMOS gates for providing a gating signal and a complementary gating signal to said first and said second pair of parallel connected CMOS gates;

a first pair of MOS gates, of first channel type, each connecting the output of said first and said second inverters, respectively, to the third node; and a second pair of MOS gates, of second channel type, each connecting the output of said first and said second inverters, respectively, to the second node.

2. The 3-input Exclusive-OR gate circuit according to claim 1 wherein:

each MOS gate of said first pair of MOS gates has a source, drain, and gate electrode, with said drain electrodes connected to the third node, the source electrode of one of said first pair of MOS gates connected to the output of said first inverter and the source electrode of the other of said first pair of MOS gates connected to the output of said second inverter, the gate electrode of one of said first pair of MOS gates connected to the source electrode of the other of said first pair of MOS gates and the gate electrode of the other of said first pair of MOS gates connected to the source electrode of the one of said first pair of MOS gates; and each MOS gate of said second pair of MOS gates has a source, drain, and gate electrode, with said source electrodes connected to the second node, the drain electrode of one of said second pair of MOS gates connected to the output of said first inverter and the drain electrode of the other of said second pair of MOS gates connected to the output of said second inverter, the gate electrode of one of said second pair of MOS gates connected to the drain electrode of the other of said second pair of MOS gates and the gate electrode of the other of said second pair of MOS gates connected to the drain electrode of the one of said second pair of MOS gates.

3. The 3-input Exclusive-OR gate circuit according to claim 1 wherein said first means is comprised of:

a first MOS transistor, of first channel type, having a gate electrode and a current path, said gate electrode connected to the output of said third inverter and said current path connected between said power potential terminal and one gate electrode of each of said first and said second pair of parallel connected CMOS gates; and a second MOS transistor, of second channel type, having a gate electrode, and a current path, said gate electrode connected to the other gate of each of said first and said second pair of parallel connected CMOS gates, said current path connected between said reference potential terminal and said one gate of each of said first and said second pair of parallel connected CMOS gates.

4. The 3-input Exclusive-OR gate circuit according to claim 1 wherein said first, second, third, and fourth inverters are each comprised of:

a pair of complementary MOS transistors each having a gate electrode and a current path, with said gate electrodes connected together to form said one input and said current paths connected in series between said power potential and said reference potential terminals, the circuit output being at the juncture of said current paths.

5. The 3-input Exclusive-OR gate circuit according to claim 1 wherein said first and said second pair of parallel connected CMOS gates is each comprised of:

a pair of complementary channel type MOS transistors each having a gate electrode and a current path, with said current paths connected in parallel and with the gate electrodes, of one channel type, of said first and said second pair of parallel connected CMOS gates connected to the gate electrodes of opposite channel type.

6. A 3-input Exclusive-OR gate circuit according to claim 1 wherein said first MOS gate and said second MOS gate are locked in an on condition by connection to said reference potential and to said power potential terminal, respectively.

7. A 3-input Exclusive-OR gate circuit comprising:

a first inverting means having inputs for receiving three input signals and having outputs for providing three inverted input signals;

a pair of current switches serially connected together at a juncture defining a first node;

means for receiving a first of said provided three inverted input signals and for outputting signals to said pair of current switches, corresponding to said inverted input signal and the complement of said inverted signal such that only one of said pair of current switches is turned on at any time;

a second inverting means having an input for receiving the signal at the first node and having an output for providing the circuit's output signal;

switching means of a first conductivity type responsive to the second and the third of said provided three inverted input signals for gating said signals to one current switch of said pair of current switches; and switching means of a second conductivity type, complementary to said first conductivity type, responsive to the second and the third of said provided three inverted input signals for gating said signals to the other current switch of said pair of current switches.

* * * * *